United States Patent [19]

Nathan

[11] Patent Number: 4,644,488

[45] Date of Patent: Feb. 17, 1987

[54] PIPELINE ACTIVE FILTER UTILIZING A BOOTH TYPE MULTIPLIER

[75] Inventor: Robert Nathan, Pasadena, Calif.

[73] Assignee: California Institute of Technology, Pasadena, Calif.

[21] Appl. No.: 541,124

[22] Filed: Oct. 12, 1983

[51] Int. Cl.$^4$ .......................... G06F 7/38; G06F 7/52
[52] U.S. Cl. ................................. 364/724; 364/736; 364/757; 382/49
[58] Field of Search ............... 364/754, 757, 760, 728, 364/724, 604, 736; 382/49

[56] References Cited

U.S. PATENT DOCUMENTS

| | | | |
|---|---|---|---|
| 3,270,188 | 8/1966 | Ares | 235/181 |
| 3,849,760 | 11/1974 | Endou et al. | 340/146.3 H |
| 3,961,172 | 6/1976 | Hutcheon | 235/181 |
| 3,995,270 | 11/1976 | Perry et al. | 328/116 |
| 4,128,890 | 12/1978 | Irwin et al. | 364/724 |
| 4,153,938 | 5/1979 | Ghest et al. | 364/757 |
| 4,156,914 | 5/1979 | Westell | 364/515 |
| 4,161,033 | 7/1979 | Martinson | 364/728 |
| 4,168,530 | 9/1979 | Gajski et al. | 364/760 |
| 4,218,752 | 8/1980 | Hewes et al. | 364/825 |
| 4,238,833 | 12/1980 | Ghest et al. | 364/760 |
| 4,244,029 | 1/1981 | Hogan et al. | 364/728 |
| 4,267,580 | 5/1981 | Bond et al. | 364/824 |
| 4,313,170 | 1/1982 | Lewis et al. | 364/517 |
| 4,314,348 | 2/1982 | Carr | 364/604 |
| 4,328,426 | 5/1982 | D'Ortenzio | 250/578 |
| 4,370,726 | 1/1983 | Caracappa | 364/604 |
| 4,489,393 | 12/1984 | Kawahara et al. | 364/754 |
| 4,490,805 | 12/1984 | Tamura | 364/728 |
| 4,538,239 | 8/1985 | Magar | 364/754 |

OTHER PUBLICATIONS

Bakis, R. et al., "Pipelined Convolver for Two-Dimensional Images," *IBM Technical Disclosure Bulletin*, vol. 14, No. 2, Jul. 1971.

Ranganath, J. S. et al., *Multiple Image Registration Using Correlation of Adjacent Pixels*, Conference Proceedings of IEEE, Apr. 1982.

*Mathematical Approach to Computational Networks*, Danny Cohen Information Sciences Institute, U.S.C. ISI/RR-78-73 ARPA Order No. 2223, Nov. 1978.

*A 16 Bit LSI Digital Multiplier*, Thesis by Rodney Tak Masumoto for the Degree of Electrical Engineer, California Institute of Technology, 5/18/78.

Primary Examiner—James D. Thomas
Assistant Examiner—Dale M. Shaw
Attorney, Agent, or Firm—Freilich, Hornbaker, Rosen & Fernandez

[57] ABSTRACT

Multiplier units of the modified Booth decoder and carry-save adder/full adder combination are used to implement a pipeline active filter wherein pixel data is processed sequentially, and each pixel need only be accessed once and multiplied by a predetermined number of weights simultaneously, one multiplier unit for each weight. Each multiplier unit uses only one row of carry-save adders, and the results are shifted to less significant multiplier positions and one row of full adders to add the carry to the sum in order to provide the correct binary number for the product Wp. The full adder is also used to add this product Wp to the sum of products ΣWp from preceding multiply units. If m×m multiplier units are pipelined, the system would be capable of processing a kernel array of m×m weighting factors.

8 Claims, 14 Drawing Figures

PIPELINE ACTIVE FILTER UTILIZING A BOOTH TYPE MULTIPLIER

ORIGIN OF INVENTION

The invention described herein was made in the performance of work under a NASA contract and is subject to the provisions of Section 305 of the National Aeronautics and Space Act of 1958, Public Law 85-568 (72 Stat. 435; 42 USC 2457).

BACKGROUND OF THE INVENTION

This invention relates to a pipeline active filter of the type commonly used as a convolver or correlator for image enhancement, data filtering, correlation, pattern extraction, Synthetic Aperture Radar (SAR) data processing, and the like.

These applications for an active filter can all use the same general group of convolution operations, namely summation of the weighted values of an input data stream of picture elements (pixels) representing (usually) a two-dimensional image. Weighting is accomplished by multiplying each pixel value by a set of 35 by 35 weighting factors, for example, to create a new output value for each pixel.

In conventional processing, using a standard digital computer, or an array processor, the data are processed sequentially, using a repetition of multiplication and summation operations on each pixel value. Thus, on an image of 1000 by 1000 pixels, filtered by a 35 by 35 weight mask (a realistic requirement), the data must be accessed and multiplied 1000×1000×35×35 times, to produce one full image. This amount of processing is obviously very slow and expensive, and thus greatly limits application of the convolution processing. When compared to the speed of acquisition of the data, even from a spacecraft transmitting slow-scan television frames, the disparity is seen to be great.

One solution is to provide more than one multiplier, and to process the data in a pipeline fashion, thereby arranging to hold the input data stream access requirements to a minimum. If the process were embodied in dedicated VLSI hardware, rather than in software (computer program), this solution could be more readily accomplished, and produced in quantities at a reasonable cost. In processing a 1000 by 1000 pixel image by a kernel of 35 by 35 weights, each pixel need only be accessed once and multiplied by all weights simultaneously, with the result that the entire image processing operation requires only 1000 by 1000 successive accesses—a saving of 1225 to one. (For two-dimensional convolution the incoming pixels are delayed for one image line length between each row of the kernel).

One approach suggested by Professor Carver Mead of California Institute of Technology to the present invention is to use the modular algorithm described by Danny Cohen, "Mathematical Approach to Computational Networks," Information Sciences Institute, U.S.C. ISI/RR-78-73 ARPA Order No. 2223, November 1978. That algorithm is diagrammed in FIG. 1. The pixel data (typically 8 bits per pixel) is input at X for multiplication by weights $W_1$, $W_2$, $W_3$ and $W_4$. Each section adds the new product (temporary product) with the output sum, S, of the previous section, indicated by a plus sign in a circle. The product sum from the previous section is passed through a unit time delay Z. Note that no delays are needed in the "upper" line.

In a digital processor, multiplication is carried out by a succession of additions, and when carried out in a digital computer using binary arithmetic, carry operations usually take up most of the operating time. Consequently much effort has gone into the design of addition/carry algorithms and circuits to reduce the carry time in digital processors. The need to propagate the carry can be made to occur less frequently than the remaining internal addition operations if some additions are carried out with carry-save operations so that only one carry-propagate operation occurs per several addition operations. The digital processor will then be more efficient.

A suitable logic design for the multipliers is shown in FIGS. 2a and 2c which can be implemented in VLSI chips as described by Rodney T. Masumoto in a thesis for an Electrical Engineer degree at California Institute of Technology, May 18, 1978. The logic design implements the special case of ternary multiplication often referred to as a modified Booth algorithm summarized in the following truth table, wherein the columns headed $Y_{i+1}$, $Y_i$ and $Y_{i-1}$ represent three successive bits of a multiplier, and the respective notations $1\times$ and $2\times$ mean one times and two times a multiplicand.

| BOOTH ALGORITHM TRUTH TABLE | | | | | | | |
|---|---|---|---|---|---|---|---|
| $Y_{i+1}$ | Y | $Y_{i-1}$ | ADD | SUB | 1X | 2X | |
| 0 | 0 | 0 | 1 | 0 | 0 | 0 | ADD ZERO |
| 0 | 0 | 1 | 1 | 0 | 1 | 0 | ADD 1X |
| 0 | 1 | 0 | 1 | 0 | 1 | 0 | ADD 1X |
| 0 | 1 | 1 | 1 | 0 | 0 | 1 | ADD 2X |
| 1 | 0 | 0 | 0 | 1 | 0 | 1 | SUB 2X |
| 1 | 0 | 1 | 0 | 1 | 1 | 0 | SUB 1X |
| 1 | 1 | 0 | 0 | 1 | 1 | 0 | SUB 1X |
| 1 | 1 | 1 | 0 | 1 | 0 | 0 | SUB ZERO |

The column on the right is an interpretation of the operation to be executed in view of the outputs in the four columns headed ADD, SUB, $1\times$ and $2\times$.

A constant shift of two bits of the multiplier Y occurs between examinations of the multiplier bit sets $Y_{i+1}$, $Y_i$, $Y_{i-1}$. After each shift, the logic looks at the present two multiplier bits $Y_i$ and $Y_{i+1}$ and the previous bit $Y_{i-1}$. (In conventional multipliers, the multiplier bits are examined one at a time). The multiplication action controlled by the logic diagram of FIG. 2a through the logic diagram of FIG. 2c allows merely shifting or not shifting under $2\times$ or $1\times$ control, and inverting or not inverting under ADD or SUB control, the multiplicand bit to be added in a carry-save adder shown in FIG. 3a before examining the next bits of the multiplier (pixel).

The logic circuit for decoding the set of three multiplier (pixel) bits shown in FIG. 2a may be implemented with FET NOR gates as shown in FIG. 2b. The logic requires an exclusive-OR gate 1 to form the command $1\times = Y_i \oplus Y_{i-1}$, add or subtract the multiplicand, depending on whether $Y_{i+1}$ is a bit 0 or a bit 1, and an exclusive-OR gate 2 followed by an AND function gate 3 to form the command $2\times = (\overline{Y_i \oplus Y_{i-1}})(Y_{i+1} \oplus Y_i)$ add or subtract twice the multiplicand, depending on whether $Y_{i+1}$ is a bit 0 or a bit 1. The logic symbols employed are conventional, with a small circle at the output signifying an inverting logic element.

It should be noted that if a pixel is to be multiplied by a set of weights simultaneously by an array of multipliers using the modified Booth decoder, only one decoder is required, but a separate shifter/-inverter circuit is required for each weight. Such a circuit defined by the logic diagram in FIG. 2c can be implemented with FET devices as shown in FIG. 2d.

The advantage of the circuits in FIGS. 2b and 2d is that they can be implemented with n-MOS integrated circuit techniques for a very large scale integrated (VLSI) circuit, together with the carry-save adder of FIG. 3, but the main advantage of this modified Booth decoder and shifter/inverter for multiplication, as used in the present invention, is that it substantially reduces the number of addition operations, and the time required for those operations. That is because carrys are saved until a final product sum is to be formed in a full adder, at which time carry propagation is allowed while the next pixel is being multiplied by the same weight. FIG. 4 illustrates a full adder which can be implemented with n-MOS integrated circuit techniques as described by Masumoto, supra.

An entire array of multiplier/adder circuits tends to defeat the desire for providing many multipliers in a small area, but if each of the multipliers uses only one row of adders in the add-shift manner of the modified Booth algorithm, much space is saved, and the operation will still be much faster than a conventional computer process. This speed is made possible by a carry-save adder at each multiplier position implemented as shown in FIG. 3 and described by Masumoto, supra. The following is the truth table of the carry-save adder.

| Si | X | Ci | So | Co |
|---|---|---|---|---|
| 0 | 0 | 0 | 0 | 0 |
| 0 | 0 | 1 | 1 | 0 |
| 0 | 1 | 0 | 1 | 0 |
| 0 | 1 | 1 | 0 | 1 |
| 1 | 0 | 0 | 1 | 0 |
| 1 | 0 | 1 | 0 | 1 |
| 1 | 1 | 0 | 0 | 1 |
| 1 | 1 | 1 | 1 | 1 |

While the truth table of the carry-save (half) adder is identical to that of a full adder, there are subtle circuit and operational differences. A full adder propagates carries; a carry-save adder defers the carry propagation to the next adder cycle. Thus, there is no carry assimilation delay.

FIG. 3b illustrates a conventional logic diagram of an adder that uses two exclusive-NOR gates. FIG. 4 illustrates an equivalent logic diagram using only NOR gates which, although it requires more gates, can be implemented more easily with n-MOS integrated circuit techniques. Both of these may be used to implement a carry-save adder or a full adder. The difference is only in how they are used. In a carry-save adder, the carry and sum outputs $C_o$ and $S_o$ are both saved in storage devices, and the carry is not propagated. Instead, both the carry and sum are added to a new bit, indicated as X in FIG. 3b, during a following bit multiplication cycle. In a full adder shown in FIG. 4, there is only one output, $S_o$. The carry, $C_o$, is not an output of the adder; instead it is an internal signal that is propagated as $C_i$ to a stage of higher order. The carry from the next lower adder is shown as $C_i$ in FIG. 4. The other two inputs, S and C, are stored sum and carry bits from a carry-save adder.

Both the carry-save adder and the full adder thus implemented in VLSI chips are used by Masumoto, supra, differently. In a 16 by 16 bit multiplier accumulator using a modified Booth decoder to sum successive products, Masumoto uses eight cascaded carry-save adders and one final adder with carry propagation, a full adder. The present invention utilizes only one carry-save adder for forming a product by successive additions of the multiplicand without carry propagation, and a full adder to assimilate the separately stored carry with the sum for a binary number sometimes referred to hereinafter as a "temporary product." The full adder is then used a second time to add this temporary product to a sum of products, thus allowing successive products to be summed in pipeline multiplying units while processing a stream of data, such as pixels in successive lines of a stored frame of pixels.

The carry-save adder as used in this invention accepts three signals; the local binary product X, a carry signal $C_{i+1}$ from the next more significant adder, and a sum signal from the second next more significant digit carry-save adder $S_{i+2}$, respectively, where the carry and sum have been calculated during the previous clock cycle so that in the logic diagram of FIG. 3a the inputs $C_i$ and $S_i$ for the outputs $S_o$ and $C_o$ are actually $C_{i+1}$ and $S_{i+2}$. In contrast, a full adder immediately adds the carry that is produced to the sum of its next more significant neighbor to produce the correct number.

Since the correct product must ultimately be produced, both carry-save adders and full adders are required by the present invention, but as just noted above, only one carry-save adder and one full adder is needed for each product binary digit so a unit to multiply an 8-bit pixel with a 16-bit weight requires an array of 25 multipliers (24 bits+carry), or for a truncated product, a lesser number, such as 22, each multiplier being comprised of a common modified Booth decoder, shifter-inverter, carry-save adder and full adder. These multiplier units use a triple bit examination approach to reduce multiply/add operations (and circuits) to half of the conventional equivalent. Together with the reduced ratio of carry operations to sum operations, this operates to make the process quite fast in this active filter.

SUMMARY OF THE INVENTION

In accordance with the present invention, multiply units of the modified Booth decoder and carry-save adder/full adder combination are used to implement a pipeline active filter wherein data elements are processed sequentially, and each element need only be accessed once to be multiplied by a number of weights simultaneously, one multiply unit for each weight. Each multiply unit uses a modified Booth decoder and only one row of carry-save adders, and the results are transferred to less significant multiplier positions for addition in subsequent operations for multiplication of bits of the element by weight. Each carry-save adder thus accepts a sum signal and a carry signal from more significant bit multiplier positions without having to add the carry signal it receives to obtain the correct sum. Each multiplier uses one row of full adders to add the carry to the sum in order to provide the correct binary number, Wp, for the product, and to also add the product to a sum of products $\Sigma Wp$ from preceding pipelined multiply units. If m×m multiplier units are pipelined, the system would be capable of processing a kernel array of m×m weighting factors.

BRIEF DESCRIPTION OF THE DRAWINGS

FIG. 2b is an FET circuit diagram for VLSI implementation of the logic diagram of FIG. 2a.

DESCRIPTION OF PREFERRED EMBODIMENTS

A multiply unit for a pipeline active filter will now be described with reference to FIG. 5 and timing diagram shown in FIG. 6. Subsequent figures will show that for a specific embodiment, it is contemplated that 8-bit pixels will be multiplied by a kernel of 35 by 35 weights. This requires one multiply unit for each weight. Assuming a 16 bit weight, the product wll consist of 24 bits plus a carry. However, where the accuracy of the less significant bits are not required, the product may be truncated, such as to 22 bits. The multiply unit must then have one bit multiplier for each bit of the product.

Figure 5:
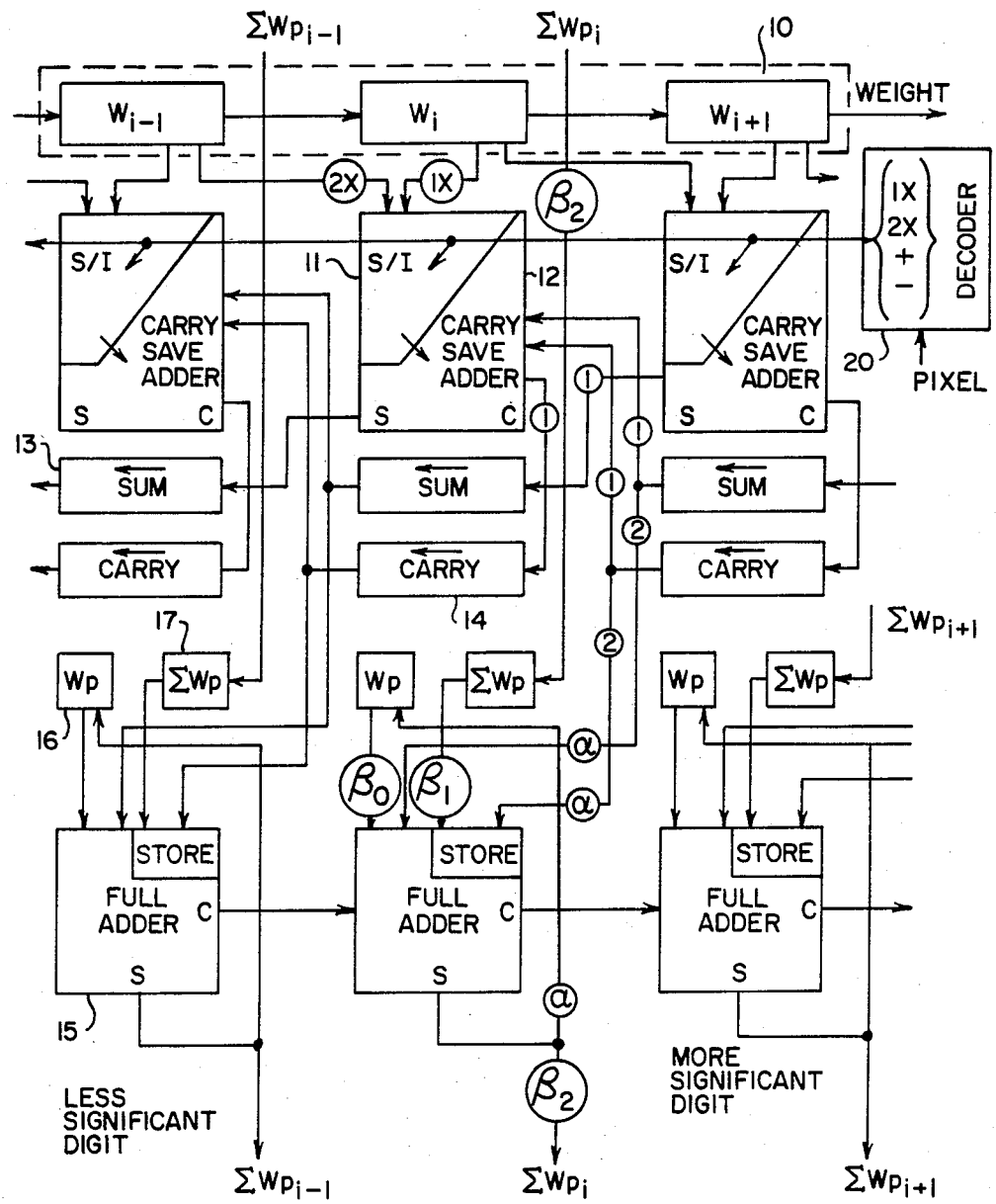
FIG. 5 illustrates the organization of an array of multipliers comprised of a common modified Booth decoder and a row of shifter/inverters (S/I), one S/I for each multiplier with one of a row of carry-save adders and one of a row of full adders for successive multiplication of pixels by a weight in accordance with the present invention.
Figure 6:
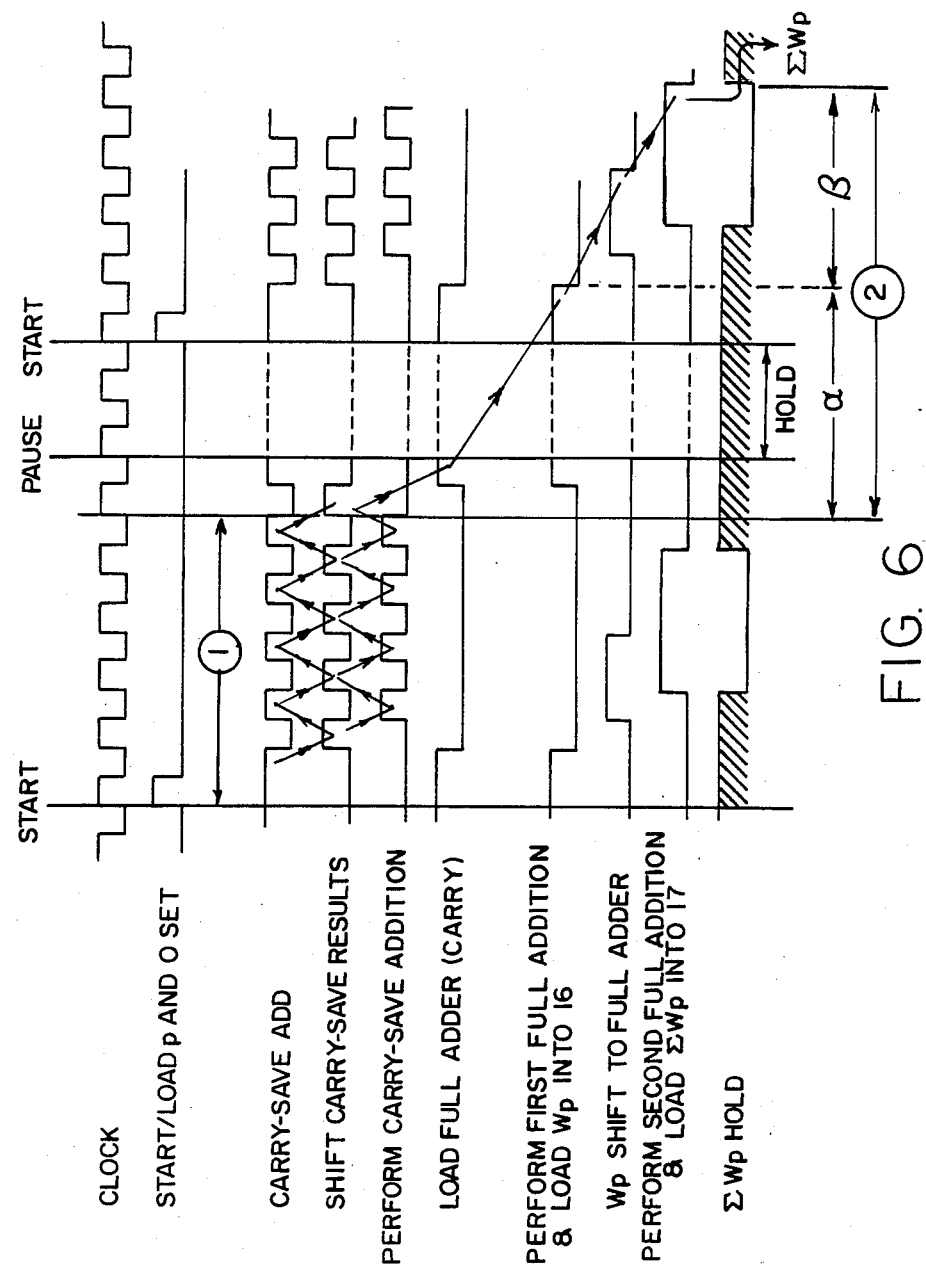
FIG. 6 is a timing diagram for the operation of the array of multipliers of FIG. 5.

Shown in FIG. 5 are just three multipliers of a multiply unit. The center one is for the i-th bit, and adjacent ones for the less significant bit, i−1, and the more significant bit i+1. Each multiplier utilizes a common modified Booth decoder (figs. 2a, 2b), and is comprised of a shifter/inverter, carry-save adder and full adder, all of which have been described by Masumoto, supra, incorporated herein by reference, but it should be understood that these prior-art components are being used herein only as examples of conventional components, instead of others that could be used, to illustrate the best mode contemplated for practicing the invention, which is with VLSI technology like that contemplated by Masumoto for his 16×16 multiplier/accumulator.

The multiply unit (multiplier/accumulator) of Masumoto differs in organization from the present invention. It requires eight rows of carry-save adders and one row of full adders, as noted hereinbefore. Thus, while specific prior-art circuits have been disclosed by Masumoto for a preferred VLSI implementation of this invention, it should be understood that this invention resides in the organization of a modified Booth decoder and a single row of each of (1) shifters/inverters (S/I) responsive to the decoder, (2) carry-save adders, and (3) full adders to form a multiply unit, and in the use of a plurality of such multiply units to form a pipeline active filter, and not in the circuits per se. Thus, the novel organization consists of a row of multipliers (a decoder, shifters/inverters and carry-save adders), one multiplier for each bit of the product, so interconnected that carry propagation is not required in this preliminary multiplication, and a single row of full adders, one for each multiplier stage, which will propagate the carries necessary for a temporary product, Wp, of the weight, W, and pixel, p. The row of full adders is used again to form the sum of the product with the accumulated sum $\Sigma Wp$ from a previous multiply unit.

Figure 7:
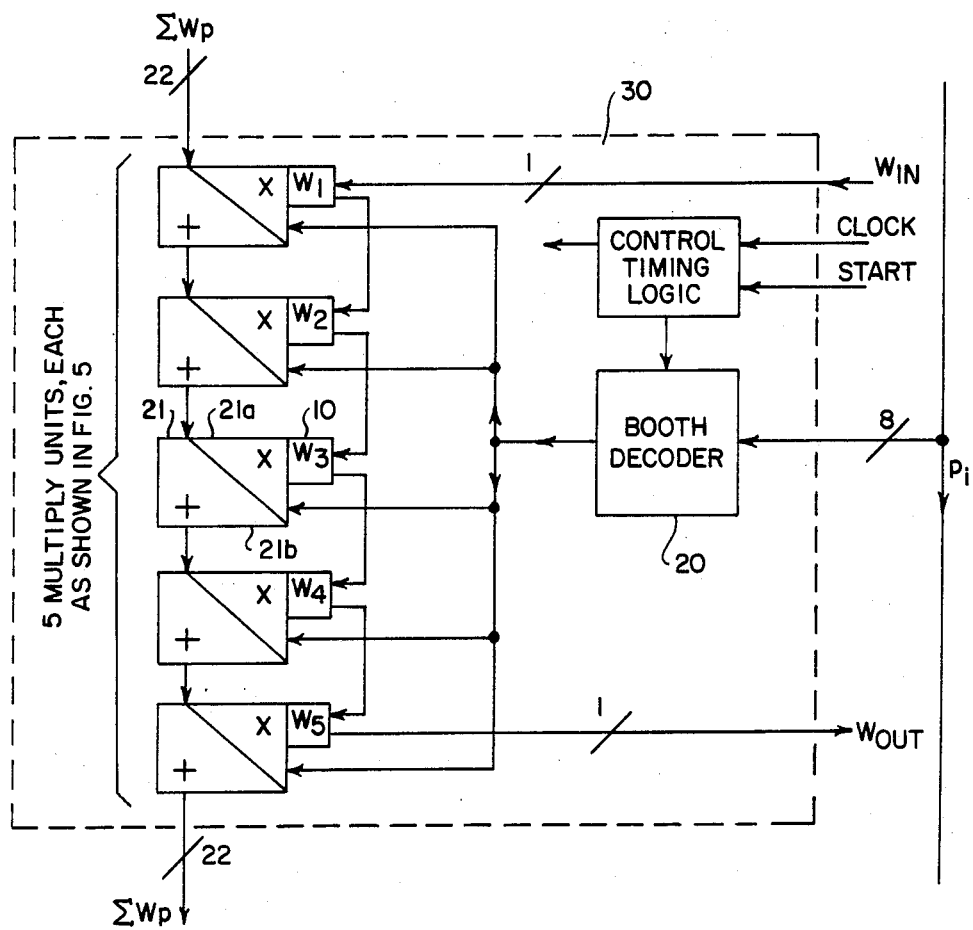
FIG. 7 illustrates schematically the manner in which five arrays of multipliers are organized for five weights on one VLSI chip.

FIG. 7 shows five such multiply units which, as will be appreciated, can conveniently be formed on a single chip 30. Each multiply unit is represented by a rectangle 21 divided into two parts, a first part 21a comprised, as shown in FIG. 5, of a row of shifters/inverters 11 with carry-save adders 12, and sum and carry storage devices 13, 14, and a second part 21b comprised, as shown in FIG. 5, of a row of full adders 15 with storage devices 16, 17 to store bits of temporary products Wp and accumulated sum of products $\Sigma Wp$. Each multiply unit receives a 16-bit weight, W, and an 8-bit pixel, p, to produce a truncated 22-bit product added to the accumulated sum of products $\Sigma Wp$ from preceding multiply units.

Figure 8:
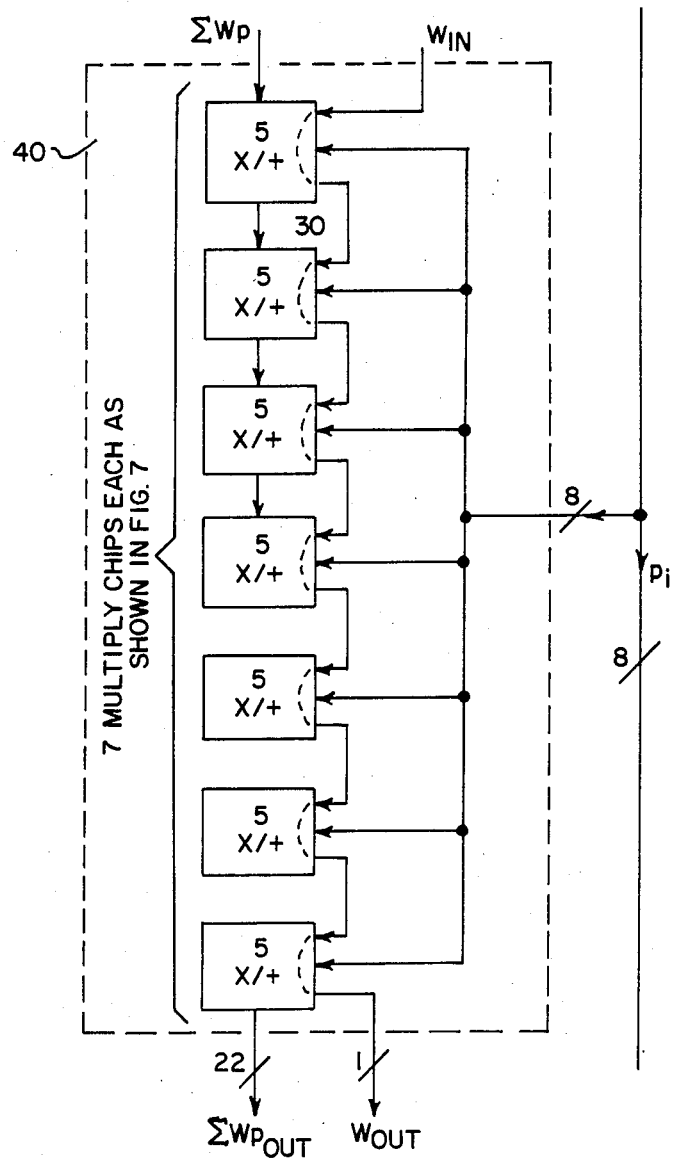
FIG. 8 illustrates schematically the manner in which the chip of FIG. 7 is combined with six more chips for simultaneously multiplying pixels by 35 weights in a one-dimensional image processor (filter).
Figure 9:
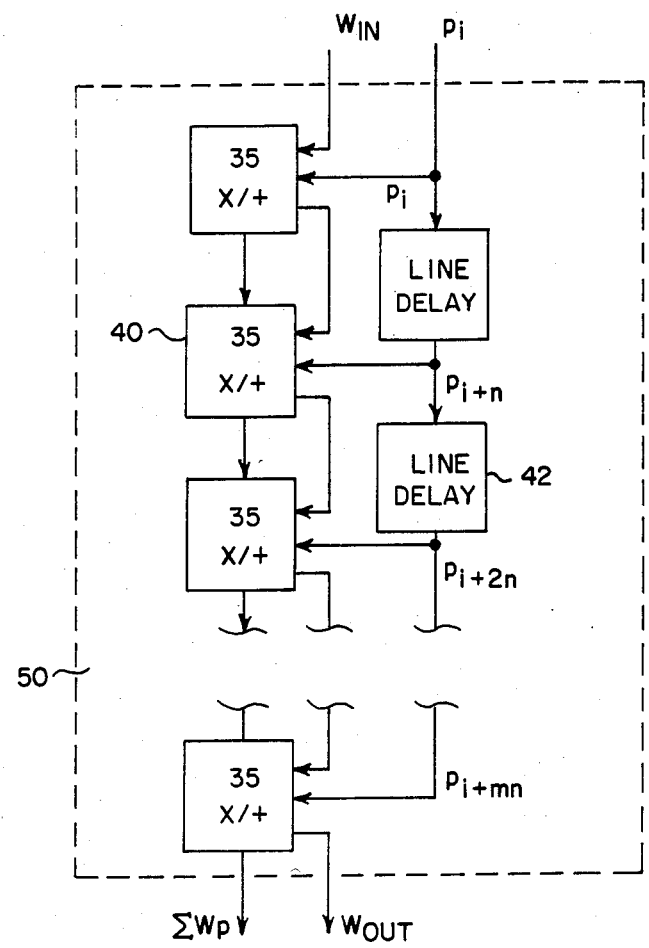
FIG. 9 illustrates the manner in which a plurality of one-dimensional image processing filters as shown in FIG. 8 are combined to form a 35 by 35 dimensional image processor (filter).

FIG. 8 shows seven such multiply chips 30 arranged to multiply each of a succession of pixels by a set of weights $W_1$ through $W_{35}$ prestored in the chips to form a pipeline active filter 40. FIG. 9 shows how 35 such active filters 40 may be connected to the train of pixels through line delays 42 to form a filter 50 used to multiply the succession of pixels by a kernel of 35 by 35 weights. Note that as the products Wp are formed, they are added to products of previous multiply units in each line of pixels, and that the accumulated sum of products for each line is added to the accumulated sum of products of the next line so that the final pixels are weighted by the 35 by 35 kernel of predetermined weights.

Figure 10:
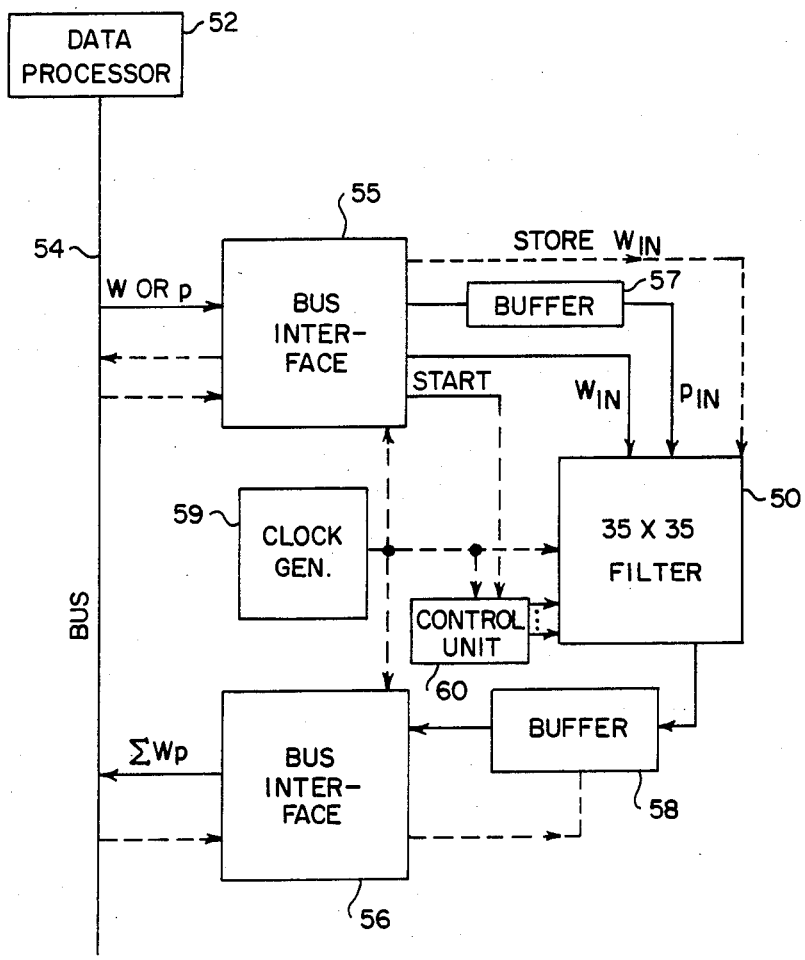
FIG. 10 illustrates the manner in which a 35 by 35 filter shown in FIG. 9 may be used in a system to process pixel data.

And finally, FIG. 10 illustrates how the 35 by 35 pipeline active filter is connected to a data processor 52 through a bus 54 and interface 55 to accept pixel data, multiply it by the 35 by 35 kernel, and return the filtered pixel data to the data processor through a bus interface unit 56. A buffer 57 is provided between the pipelined active filter 50 and the input bus interface 55 to store at least a significant fraction of frame of pixels for filtering. A buffer 58 is similarly provided between the pipelined active filter and the return bus interface 56. Control lines through which the data processor supervises the system are indicated by dotted lines. The system is synchronized by a local clock generator 59, and the pipelined active filter itself is controlled by a sequence control unit 60 for carrying out the necessary operations in the multiply units of the filter as will be more fully described with reference to FIGS. 5 and 6. Although shown in FIG. 10 as a single control unit for all chips having five multiply units, it is preferred to duplicate the sequence control unit on each chip as shown in FIG.

7 by a block 60 labeled control timing logic. The sequence control function is implemented with a sequence step counter. Distributed sequence control then minimizes the number of input pins required for each chip. With that overview, the structure and operation of one multiplier for the i-th and adjacent stages of a multiply unit will now be described with reference to FIGS. 5 and 6.

The i-th bit of the multiplier (weight W) is prestored in one stage of a shift register 10, of which only three stages ($W_{i-1}$, $W_i$ and $W_{i+1}$) are shown. Loading this register is indicated to be from left to right, i.e., from the less significant stage to the more significant stage. Once loaded with the prescribed weight, processing of pixel data may commence.

The 8-bit pixels, p, are received by a modified Booth decoder 20 common to five multiply units, as shown in FIG. 7, but shown in FIG. 5 as though dedicated to just one multiply unit of which only three of twenty-two stages are shown. The output of the decoder is a set of four signals, namely $1\times$, $2\times$, ADD (+) and SUB(−), as explained with reference to FIG. 2a and 2b. Each multiplier includes its own shifter/inverter (S/I) circuit 11 responsive to those four signals, as explained with reference to FIGS. 2c and 2d. Each multiplier has two weight bits as inputs, one from the stage i−1 of the register 10 of less significance, and one from the stage i of the register 10 of the same significance. The shifter/inverter will select bit $W_{i-1}$ or $W_i$, according to whether $2\times$ or $1\times$ is true, and invert the bit according to whether it is to be added or subtracted (complementing and adding) which depends upon whether ADD or SUB is true. The $2\times$ and $1\times$ control distributed from the decoder 20 to each shifter/inverter is indicated by circled $2\times$ and $1\times$ in the inputs to the shifter/inverter of the i-th stage. The ADD and SUB control is similarly distributed, though not otherwise indicated in FIG. 5, to all other stages of the multiply unit. The selected bit $W_{i-1}$ or $W_i$ is then added or subtracted (by addition of the complement) in the associated carry-save adder 12 shown in FIG. 3.

The resulting sum bit, S, is temporarily stored in a bistable device 13 shown with the next less significant stage of the register 10 for convenience, and any carry bit, C, is temporarily stored in a bistable circuit 14 shown directly below the carry-save adder of the i-th stage. Note that the sum store device associated with the more significant stage i+1 is shown below the i-th stage, but that its output is an input not to the i-th carry-save adder, but to the next less significant bit carry-save adder, while the carry of the i-th stage is fed from bistable circuit 14 directly to the next less significant bit carry-save adder. All of this carry-save add and store takes place during a first mode of operation indicated by a circled 1 in the connecting lines of FIG. 5, and a circled 1 in the timing diagram of FIG. 6.

This first mode lasts for five cycles of the system clock in order to process all digit bits of a pixel. In the sixth cycle of the clock, which initiates a second mode indicated by a circled 2 in the connecting lines of FIG. 5, and a circled 2 in the timing diagram of FIG. 6, the sum and carry of each multiplier stage is loaded into the full adder 15 associated with the less significant stage. Each half cycle of the clock is a step in the sequence controlled by the control unit 60 (FIG. 10), keeping in mind that the 8-bit pixel (multiplier in the modified Booth algorithm) requires five passes to decode in groups of three as follows:

| Pass 1 | 0 | $P_1$ | $P_2$ |
| Pass 2 | $P_2$ | $P_3$ | $P_4$ |
| Pass 3 | $P_4$ | $P_5$ | $P_6$ |
| Pass 4 | $P_6$ | $P_7$ | $P_8$ |
| Pass 5 | $P_8$ | 0 | 0 |

In the first pass, the first two bits of the multiplier appear in place for modified Booth decoding. Then shifting two bits at a time, it takes four more passes for all eight bits to be processed. The weights (multiplicands) are loaded before processing starts, and are held for the duration of the image frame processing, although weights could be altered during processing, if desired.

After five clock cycles, processing an 8-bit pixel through the multiplier is complete. In order that the results (saved sum and carry) can be added, the second mode is initiated by the first half of the sixth clock period at the beginning of mode 2 identified by a circled 2 in FIG. 6. The second mode is comprised of two phases, an $\alpha$ phase which extends through the first clock pulse period after the next start pulse, and a following $\beta$ phase which extends from the end of $\alpha$ for three clock cycles, which is to say for more than half the period remaining before the next start pulse. The $\alpha$ phase may be made as long as necessary to await the start pulse when the next pixel is available. In practice, this hold period may be reduced to zero for very fast VLSI circuits.

As just noted there are two phases in this second mode. The operations to be completed in the first phase are identified by a circled $\alpha$ in the lines connecting the sum and carry of each multiplier stage to the full adder 15 of the next less significant stage, and connecting the sum output of the full adder to a device 16 for storing a temporary product, Wp. This first phase operation is identified in FIG. 6 also by a circled $\alpha$. Note that only the carry from the next more significant stage is stored in an input storage device of the adder. This occurs at the center of the sixth clock pulse, as indicated by the waveform labeled "load full adder" in FIG. 6. While both the sum and carry bits could be stored, in practice it is not necessary to store either one since addition begins immediately, and the temporary product Wp is loaded into the storage device 16 as indicated by the waveform labeled "load Wp into 16" in FIG. 6. The reason the carry is loaded into the input storage device is only because it is necessary to later store the sum of products bit, $\Sigma Wp$, in storage device 17, and that storage device is used to multiplex between first the carry of the next more significant stage, and then the sum of products, $\Sigma Wp$.

The carry and sum are added in each full adder during the $\alpha$ phase of the second mode to the temporary product, Wp, from device 16, and the sum, Wp, is stored in the device 16. All of this takes place in the period between the middle of the first clock pulse cycle of mode 2, to the end of one clock pulse cycle after the next start pulse. This is sufficient time to propagate the carries in forming the temporary product. Thus, the operation taking place during a long pulse period labeled "load Wp into 16" is to perform the first addition in the full adder. The addition is of the sum and carry bits saved during mode 1. The temporary product, Wp, is indicated as an input to the full adder 15 by a circled $\beta_0$ in the connection shown in FIG. 5. The next start pulse loads the next pixel into the decoder 20 for processing, and the mode 1 sequence is repeated for the next pixel. Meantime, the temporary product, Wp, is "shifted" (gated) into the full adder as an input labeled $\beta_0$ in FIG. 5. This occurs in the middle of the second clock pulse period after a start pulse. At the end of that second pulse period, the preceding sum of products $\Sigma Wp$ from storage device 17 is loaded as input $\beta_1$ into the input storage of the adder to start the second addition of $\beta_0$ to $\beta_1$. The output indicated as $\beta_2$ in FIG. 5 is then held in storage device 17. Because a new sum of products is being stored (from a preceding multiply unit), it is necessary to store the old sum of products (input $\beta_1$ to the full adder) in the input storage device of the full adder to free the storage device 17 for the new sum of products (input $\beta_2$ from the preceding multiply unit).

Thus, while the next pixel is being processed through five passes in the carry-save adder, the full adder adds the temporary product stored in device 16 to the old sum of products $\Sigma Wp$ previously stored in a storage device 17 to form a new sum of products $\Sigma Wp$. The old sum of products is identified by a circled $\beta_1$ in the connection from the storage device 17 to the full adder 15, and new one is identified by a circled $\beta_2$ at the output of the full adder 15, which forms the sum $\beta_0 + \beta_1 = \beta_2$ where $\beta_0$ is the temporary product sum Wp formed by adding the bits transferred to the full adder, and from the full adder to the storage device 16 during the $\alpha$ phase of the second mode. The new sum of this multiply unit is then stored in the device 17 of the next multiply unit in succession. While reference has been made to only one stage, it should be understood that in this exemplary embodiment there are 22 stages in each multiply unit operating in parallel.

In summary, the first mode forms the sum and carry bits of a new temporary product, Wp, while a second mode forms the temporary product and adds it to the accumulated sum of products, $\Sigma Wp$ from a preceding multiply unit. These two modes overlap from one pixel to the next, which is to say that while the second mode for one pixel is being completed, the first mode for the next pixel is started and completed. The second mode has two phases, a first $\alpha$ phase during which the product sum produced by the multiplying unit is formed and saved in the storage device 16. Operations of the first phase are identified in FIGS. 5 and 6 by a circled $\alpha$ and they are for addition of the sum and carry of the next more significant carry-save adder, thus forming a temporary product sum, identified in FIGS. 5 and 6 by a circled $\beta_0$, and a second $\beta$ phase to form a new product sum $\Sigma Wp$ identified in FIG. 5 by a circled $\beta_2$ from the addition of the temporary product Wp to an old sum of products $\Sigma Wp$ stored in the device 17 from the preceding multiplying unit, and identified in FIG. 5 by a circled $\beta_1$.

The description of FIG. 5 began with reference to just the i-th stage of a 22 bit multiply unit, it being understood that, in this exemplary embodiment, there are five 22 bit multiply units on a chip operating with a single multiplier decoder 20, as shown in FIG. 7. But in the end it became convenient to speak of the sum $\Sigma Wp$ of the products of the entire multiply unit as formed by the array of full adders (stages) which have carry propagation between them. Since this full adder is used in this way while the next pixel is being processed, there is sufficient time for the full adder to propagate the carries, first in forming the new temporary product Wp during the indefinite hold period shown in FIG. 6, and then in forming the new sum of products $\Sigma Wp$ shown as $\beta_2$ going out of the timing diagram at the lower right of FIG. 6. That sum of products $\Sigma Wp$ is introduced into the next pipelined multiply unit shown in FIG. 7, as indicated by the circled $\beta_2$ in the connecting lines in FIG. 5. This is all under the sequence control of the control unit 60 (FIG. 10) which generates the signals shown in the timing diagram of FIG. 6 to effect the control described with reference to FIGS. 5 and 6. The sequence of steps, one step for each half cycle of the clock, are as follows:

FIRST MODE—(initiated by START pulse)

Figure 1:
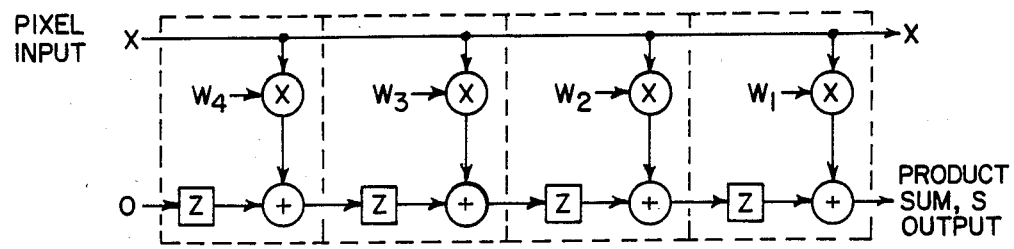
FIG. 1 illustrates a prior-art finite impulse response filter for multiplying pixels in sequence by a set of weights $W_1$ through $W_4$.
Figure 2A:
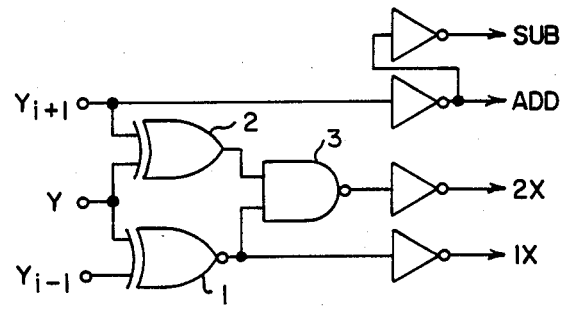
FIG. 2a is a logic diagram of a prior-art modified Booth algorithm useful in implementing a multiplier for the present invention.
Figure 2B:
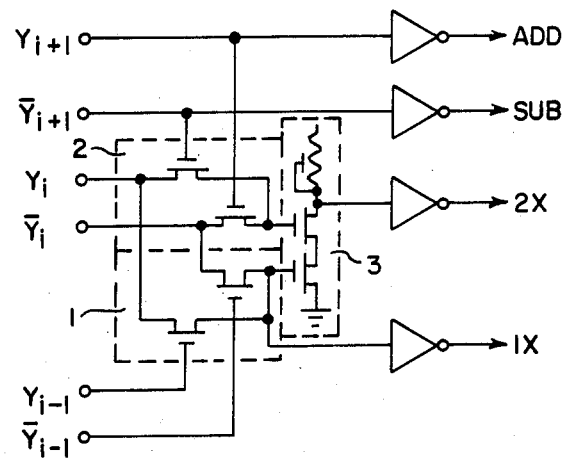
Figure 2C:
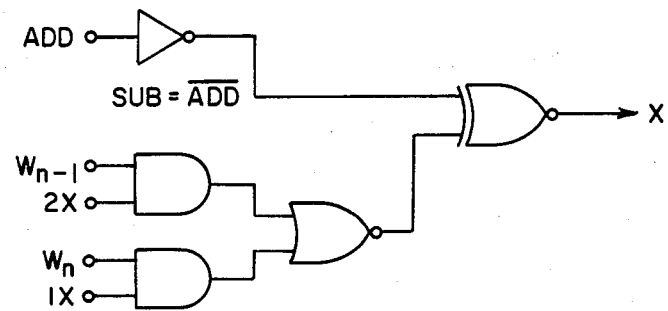
FIG. 2c is a logic diagram for a shifter/inverter useful with a modified Booth decoder for implementing a multiplier for the present invention.
Figure 2D:
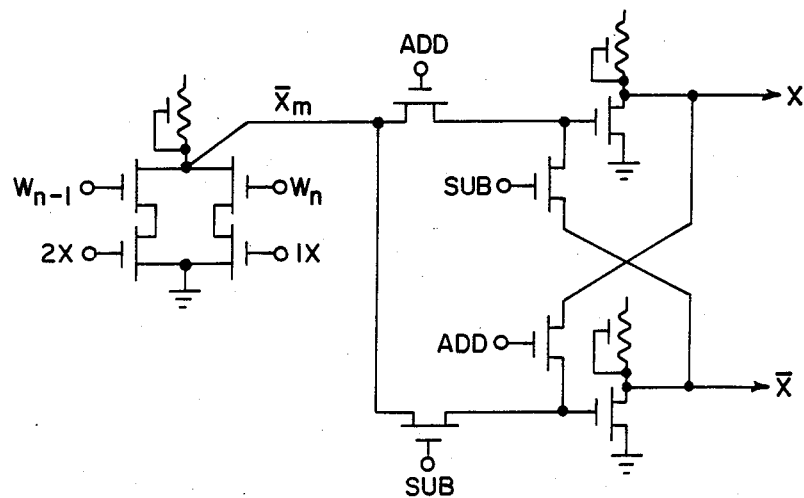
FIG. 2d is an FET circuit diagram for VLSI implementation of the logic diagram of FIG. 2c.
Figure 3A:
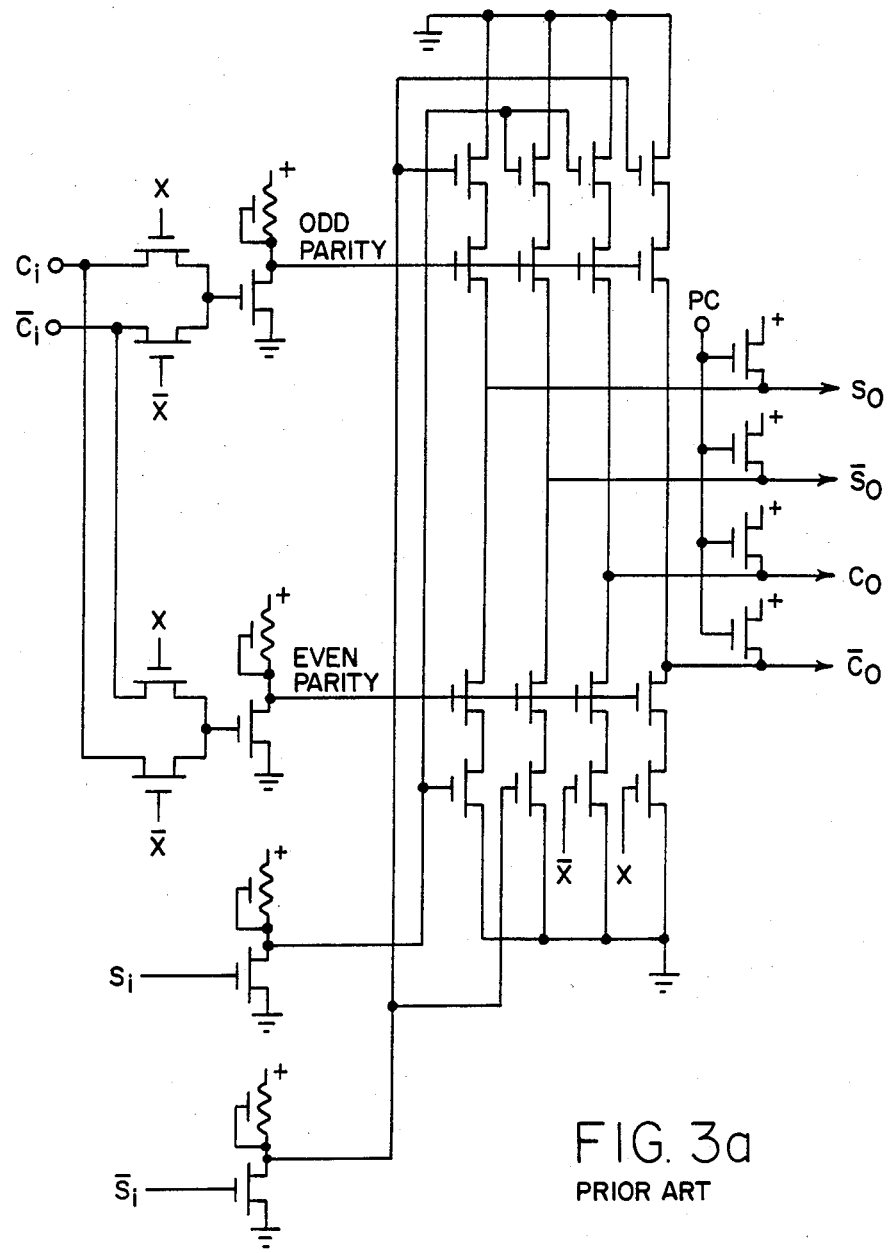
FIG. 3a is a VLSI circuit diagram of a prior-art carry-save adder useful in implementing the present invention.
Figure 3B:
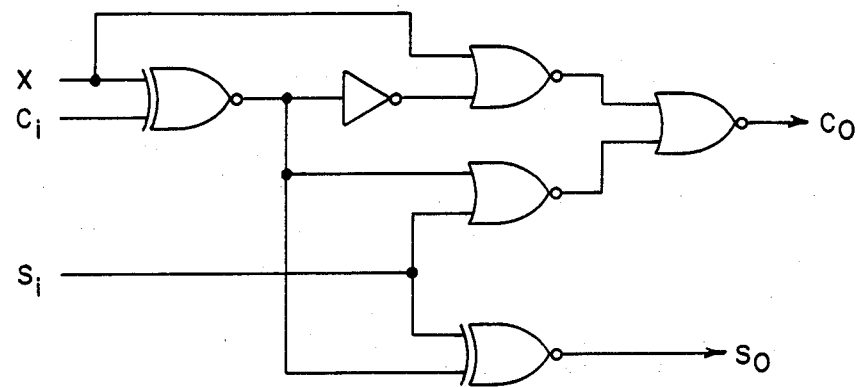
FIG. 3b is a logic diagram of that adder.
Figure 4:
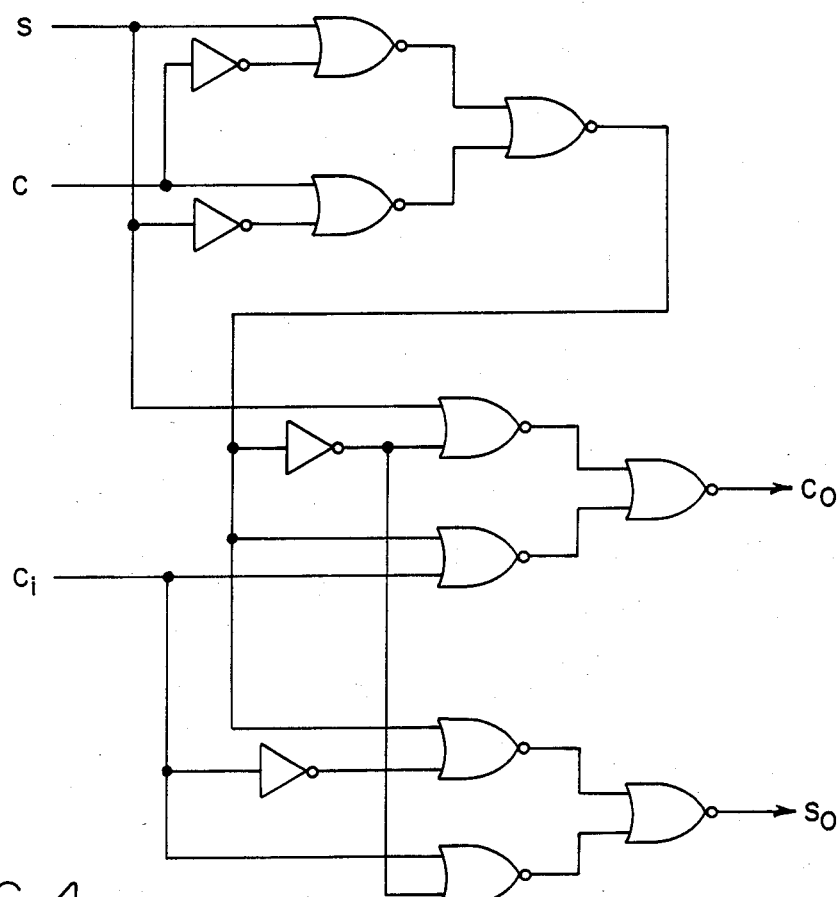
FIG. 4 is a logic diagram of a prior-art full adder useful in implementing the present invention.

1. 8-bit pixel loaded into decoder register (not shown in FIGS. 2a and 2b). Enter $P_0(=0)$, $P_1$, $P_2$ in decoder proper. Multiply by adding or subtracting $1\times$ or $2\times$ weight bits as determined by decoder, and latch decoder output. 2. Prior carry and sum blocked, and zero inserted into carry-save adder. Generate sum and carry and store in devices 13 and 14. Enter $P_2$, $P_3$ and $P_4$ in decoder proper.

3. $P_2$, $P_3$, $P_4$ shifted into decoder proper. Shift carry and sum of carry-save adders.

4. Multiply by adding or subtracting $1\times$ or $2\times$ weight bits as determined by decoder and add prior carry from next more significant stage and sum from second more significant stage.

5. and 6. Repeat steps 3 and 4 with $P_4$, $P_5$ and $P_6$.

7 and 8. Repeat steps 3 and 4 with $P_6$, $P_7$ and $P_8$.

9 and 10. Repeat steps 3 and 4 with $P_8$, $P_9(=0)$ and $P_{10}(=0)$.

SECOND MODE 12 through 2'. Complete $\alpha$ connections in FIG. 5 for storage of sum and carry from carry-save adder of next more significant stage. Hold through next START pulse. Generate temporary product sum by adding sum and carry from carry-save adder of next more significant stage, with full propagation of carries, and store temporary product sum in device 16.

1'. START pulse generated to commence multiplication of next pixel by steps 1–10 above.

2'. Continue to hold temporary product from step 12.

3'. Enter temporary product from storage device 16 to full adder.

4' through 8'. Generate the new sum of products $\Sigma W_p$ by adding content of device 16 to content of device 17, after first transferring content of device 17 to input storage of full adder 15 to temporary product sum in device 16 to output a new sum of products $\Sigma W_p$ from full adder.

9'. Hold new sum of products, and continue to hold until the second clock pulse after the next START pulse.

Although particular embodiments of the invention have been described and illustrated herein, it is recognized that modifications and variations may readily occur to those skilled in the art. Consequently, it is intended that the claims be interpreted to cover such modifications and variations.

What is claimed is:

1. A pipeline active filter wherein a succession of n-bit data elements are processed sequentially, and each n-bit element need only be accessed once to be multiplied by a number of weights, comprising:

a plurality of multiply units having a modified Booth decoder means for decoding three bits of each element at a time in increasing order of significance with one bit overlap, and generating commands to add or subtract the weight, or zero, and to multiply the weight by 1 or 2 when it is added or subtracted, and a plurality of multiplier stages, one multiplier stage for each bit of the weight, each multiplier stage comprising;

inverter/shifter means for shifting or not shifting by one bit position the bit of the weight to be added or subtracted, thereby multiplying the weight by one or by two, and inverting or not inverting the bit of the weight, thereby adding the weight or forming the complement for subtraction of the weight by addition, a carry-save means for adding or subtracting zero or the weight multiplied by one or the weight multiplied by two without propagation of carries, all in response to said modified Booth decoder means, each time shifting the sum of partial products relative to the weight so that the weight is added to successively higher orders of the partial products being accumulated without propagation of carries, storage means for the sum and carry bits of each carry-save means for transfer of the sum bit to second less significant carry-save means, and of the carry bit to the next less significant carry-save means during multiplication of successive bits of the element by addition of the weight, and for storing the sum and carry bits of the last partial product generated after multiplication by the last bit of the element, and a full-adder means for adding said final sum and carry of the next more significant stage to form a temporary product, and thereafter for adding said temporary product to an old sum of products from a preceding multiply unit to form a new sum of products as an output to the next multiply unit.

2. A pipelined active filter as defined in claim 1, including a number of sets of multiply units connected in cascade, each set with separate modified Booth decoder means for decoding pixels in sequence, and including line delay means between decoders, whereby the sum of products of said data elements multiplied by said weights in said sets of multiply units to multiply each of said elements by a kernel of weights, said kernel consisting of a number of weights equal to the number of multiply units in a set and an additional number of weights equal to the number of sets.

3. A pipeline active filter for image data processing having a number M×N of like multiply units connected in cascade in sets with the sum of products out of one set connected as an input to the next set for producing a sum of M×N image elements multiplied by M×N weights, where M is the number of image elements in a line of N lines of a two dimensional image, each of said multiplying units for a given weight comprising:

means for storing a multiplier W having a plurality of bits, means for accessing each multiplicand in sequence for multiplication by said multiplier, modified Booth decoder means for determining the operation to be performed for multiplication of successive bits of said multiplicand by multiplier bits, and multiplying means responsive to said modified Booth decoder means and said multiplier storing means, for forming the product of said multiplicand and said multiplier as a sum of partial products without propagation of carries until a final sum is formed as the product, said multiplying means comprising;

a row of carry-save adders, one adder for each bit $W_i$ of said multiplier for forming the sum and carry bits of bit multiplication without propagation and addition of carries between adders, but with shifting of sum and carry bits of each partial product relative to said bits of said multiplier, a shifter/inverter for each carry-save adder responsive to said modified Booth encoder for adding or subtracting by adding the complement of a bit $W_i$ or $W_{i-1}$ in said carry-save adder in forming a sum and carry, means for temporarily storing said sum and carry bits from carry-save adders between steps of successive processing of multiplicand bits, a row of full adders, one full adder for each multiplicand bit, adding all said sum and carries stored in said temporary storing means after the last of said multiplicand bits have been processed through said modified Booth decoder, whereby a product is formed with a row of carry-save adders, one per multiplicand bit, without the need for carry propagation in forming partial products, means for storing said product temporarily, control means for adding a temporary product stored in said temporary product storage means with a sum of products from a preceding multiply unit of a set, or preceding set, to form a new sum of products input to the next succeeding multiply unit of a set, or the next set, and means for delaying successive elements by one line between groups of M multiplying units set to form a two-dimensional convolution of elements.

4. A pipeline active filter for image data processing as defined in claim 3 wherein said multiplicand is comprised of m bits, and said modified Booth decoder samples and decodes three multiplicand bits at a time, starting with 0 and the first two multiplicand bits, and thereafter shifting two bit positions and examining three bits during each successive multiply cycle for n cycles, where n is a minimum number of cycles necessary for said modified Booth decoder to thus process all multiplicand bits and said carry-save adder to perform carry-save addition operations, and wherein said full adder performs two carry propagate additions following each of n cycles, whereby all sum and carry bits for multiplication of the next element by a weight are formed and temporarily stored in n cycles, while a product is formed by addition of previous partial product sum and carry bits and said product thus formed is added to a previous sum of products to form a new sum of products.

5. In a multiplier wherein multiplicands are processed sequentially, each multiplicand having a plurality of bits, the combination of:

means for storing a multiplier W having a plurality of bits, means for accessing each multiplicand in sequence for multiplication by said multiplier, modified Booth decoder means for determining the operation to be performed for multiplication of successive bits of said multiplicand by multiplier bits, and multiplying means responsive to said modified Booth decoder means and said multiplier storing means for forming sum and carry bits of partial products of said multiplicand and said multiplier without propagation of carries until a final addition of said sum and carry bits is formed as the product, said multiplying means comprising;

a row of carry-save adders, one adder for each bit $W_i$ of said multiplier for forming the sum and carry bits of bit multiplication without propagation and addition of carries between adders, but with shifting of said sum and carry bits relative to said bits of said multiplier, a shifter/inverter for each carry-save adder responsive to said modified Booth encoder for adding or subtracting by adding the complement of a bit $W_i$ or $W_{i-1}$ in said carry-save adder in forming a sum and carry, means for temporarily storing said sum and carry bits from carry-save adders between steps of successive processing of multiplicand bits, and a row of full adders, one full adder for each multiplicand bit, adding all said sum and carries stored in said temporary storing means after the last of said multiplicand bits have been processed through said modified Booth decoder, whereby a product is formed with a row of carry-save adders sum of partial products, without the need for carry propagation in forming partial products.

6. The combination of claim 5 including means for storing temporarily said product produced by said full adder, and means for temporarily storing a previous sum of products, and including control means for using said full adder to form a new sum of products by adding a product just formed to said previous sum of products while said multiplying means processes bits of a succeeding multiplicand, whereby a plurality of multiplicands may be multiplied by a multiplier to form a sum of products.

7. A pipeline processor for image elements having a number of like multiplying units connected in cascade in sets with the sum of products out of one set connected as an input to the next set, and including means for delaying successive lines of image elements applied as multiplicands to said multiplying units in sets by the number of elements in an image row, each multiply unit having means for accessing each element only once for a set of weights by each of successive elements, said multiplying means for each weight comprising:

means for storing a multiplier W having a plurality of bits, means for accessing each multiplicand in sequence for multiplication by said multiplier, modified Booth decoder means for determining the operation to be performed for multiplication of successive bits of said multiplicand by multiplier bits, and multiplying means responsive to said modified Booth decoder means and said multiplier storing means for forming partial products of said multiplicand and said multiplier without propagation of carries until a final addition is performed as the product, said multiplying means comprising;

a row of carry-save adders, one adder for each bit $W_i$ of said multiplier for forming the sum and carry bits of bit multiplication without propagation and addition of carries between adders, but with shifting of said sum and carry bits relative to said bits of said multiplier, a shifter/inverter for each carry-save adder responsive to said modified Booth encoder for adding or subtracting by adding the complement of a bit $W_i$ or $W_{i-1}$ in said carry-save adder in forming a sum and carry, means for temporarily storing said sum and carry bits from carry-save adders between steps of successive processing of multiplicand bits, a row of full adders, one full adder for each multiplicand bit, adding all said sum and carries stored in said temporary storing means after the last of said multiplicand bits have been processed through said modified Booth decoder, whereby a product is formed with just one row of carry-save adders sum of partial products, without the need for carry propagation in forming partial products, means for storing said product temporarily, and control means for adding a temporary product stored in said temporary product storage means with a sum of products from a preceding multiply unit of a set, or preceding set, to form a new sum of products input to the next succeeding multiply unit of a set, or the next set.

8. A pipeline processor as defined in claim 7 wherein said multiplicand is comprised of m bits, and said modified Booth decoder samples and decodes three multiplicand bits at a time, starting with 0 and the first two multiplicand bits, and thereafter shifting two bit positions and examining three bits during each successive multiply cycle for n cycles, where n is a minimum number of cycles necessary for said modified Booth decoder to process all multiplicand bits and said carry-save adder to perform carry-save addition operations, and wherein said full adder performs the first of said two carry propagate additions following each of n cycles, whereby all sum and carry bits for a multiplication are formed and temporarily stored in n cycles, while a sum of previous sum and carry bits are added to form a temporary product and a temporary product is added to a previous sum of products to form a new sum of products with propagation of carries.

* * * * *